United States Patent [19]

Amador

[11] Patent Number: 5,471,462
[45] Date of Patent: Nov. 28, 1995

[54] BIPHASE BUS MONITOR

[75] Inventor: José J. Amador, Cocoa, Fla.

[73] Assignee: The United States of America as represented by the United States National Aeronautics and Space Administration, Washington, D.C.

[21] Appl. No.: 219,327

[22] Filed: Mar. 28, 1994

[51] Int. Cl.⁶ .................................................. H03M 5/00
[52] U.S. Cl. ............................ 370/17; 370/85.1; 341/70
[58] Field of Search ................................. 370/13, 14, 17, 370/85.1; 341/68, 70

[56] References Cited

U.S. PATENT DOCUMENTS

| | | | |
|---|---|---|---|
| 4,007,329 | 2/1977 | McClain et al. | 375/107 |
| 4,371,839 | 2/1983 | Rubin | 329/304 |
| 4,581,750 | 4/1986 | Dieleman | 375/55 |
| 4,853,943 | 8/1989 | Laws | 375/87 |
| 4,905,257 | 2/1990 | Palkert et al. | 341/70 |
| 5,007,050 | 4/1991 | Kasparian et al. | 370/77 |
| 5,023,891 | 6/1991 | Johnson, III | 341/70 |
| 5,111,450 | 5/1992 | Cooledge et al. | 370/13 |

Primary Examiner—Douglas W. Olms
Assistant Examiner—Min Jung
Attorney, Agent, or Firm—William J. Sheehan

[57] ABSTRACT

A system for enabling easier monitoring of a system bus, including the capturing of data transmitted on the bus and the conversion of the captured data from one format to another format, specifically biphase Manchester II signals to NRZ signals. The system allows the storage of captured data including the display of converted data for easier analysis.

7 Claims, 13 Drawing Sheets

BIPHASE BUS MONITOR

ORIGIN OF THE INVENTION

The present invention was made by an employee of the United States Government and may be manufactured and used by or for the government for government purposes without the payment of any royalties thereon or therefor.

BACKGROUND OF THE INVENTION

1. Field of the Invention

The present invention generally relates to a system for monitoring a bus, including the conversion of bus data having one type of data format to data having a different format type.

More specifically, the present invention provides a method and apparatus which facilitates the monitoring of a bus which uses Manchester II coded signaling. In addition, the present invention includes the converting of Manchester II biphase coded signals into non-return to zero digital signals.

The present invention is of particular utility with regard to troubleshooting the Spacelab bus. The capability to read data directly from the Spacelab bus is often of great benefit to test engineers. The Spacelab bus uses a type of data communication which makes monitoring of the bus particularly difficult. The present invention provides the means by which test engineers can quickly and accurately monitor the Spacelab bus.

2. Description of the Prior Art

There exists only one previous method and device that allows troubleshooters to read data directly off the Spacelab bus. Using an oscilloscope, a test engineer interfaces directly with the bus, at service points or patches, and then reads the intercepted sixteen bit Manchester II pattern displayed on the oscilloscope screen. Unfortunately, Manchester II is very difficult to read because it contains mid-bit transitions that represent zeroes and ones, with respect to a clock. Manchester II is a form of Pulse Amplitude Modulation operating on a digital baseband wherein for a "0" in Manchester II, $-V$ volts is sent for the first half of the sampling interval and a $+V$ is sent for the second half of the sampling interval. A "1" is transmitted by sending $+V$ volts for the first half of the sampling interval and $-V$ volts for the second half of the sampling interval. In Manchester II, therefore, a transition is generated for each digital "bit" transmitted, whether a "0" or a "1". A test engineer will typically read sixteen of these bits, manually recording what each bit represents.

While the use of an oscilliscope allows the engineer to manually convert the Manchester signal to binary, although with difficulty, this is unsatisfactory for yet another reason. NASA practice dictates that data records be kept in hex format. Therefore, once acquiring the binary representation of the Manchester word, a second conversion from binary to hexadecimal is necessary to provide data in the appropriate hex format.

Another disadvantage of the oscilloscope method is its inability to "capture" more than just a handful of Manchester words. The oscilloscope can capture at most two "readable" words. The resulting waveforms on the oscilloscope are unreadable (i.e., the start and end of a bit is indeterminable). With these limitations, test engineers can only convert a handful of words at a time in their efforts to troubleshoot data found on the Spacelab bus.

From the description above, it is obvious that using an oscilloscope is a time consuming method of converting Manchester II waveforms to hexadecimal. Use of an oscilliscope requires two manual conversions for a single Manchester word. This is a tedious and painstaking job that is prone to human error.

BRIEF SUMMARY OF THE INVENTION

The present invention is a method and apparatus for data retrieval and conversion that provides the capability to: capture words in a first format directly off a bus; convert the captured words to a different format; and, store the converted words for display in a very quick, efficient and accurate manner.

Through inventive hardware and software, the present invention converts from Manchester II to NRZ. In addition, through appropriate external circuitry and programming, the present invention provides a convenient platform from which data conversions can be accomplished quickly and conveniently, thus converting data to a variety of formats for viewing and storage.

The present invention can convert and store up to 1,024 words in a matter of seconds. The stored words can be re-read as many times as necessary to review the captured data.

The architecture of the present invention allows the reading of data from buses varying in size from 2 to 28 bits. This makes it attractive for use by a variety of checkout systems.

The present invention can be configured to start capturing data words after finding a specific word on the bus. This is called trigger capability, and any word believed to be on the bus can be the trigger.

The present invention can monitor two buses simultaneously.

DESCRIPTION OF THE INVENTION

Figure 1:
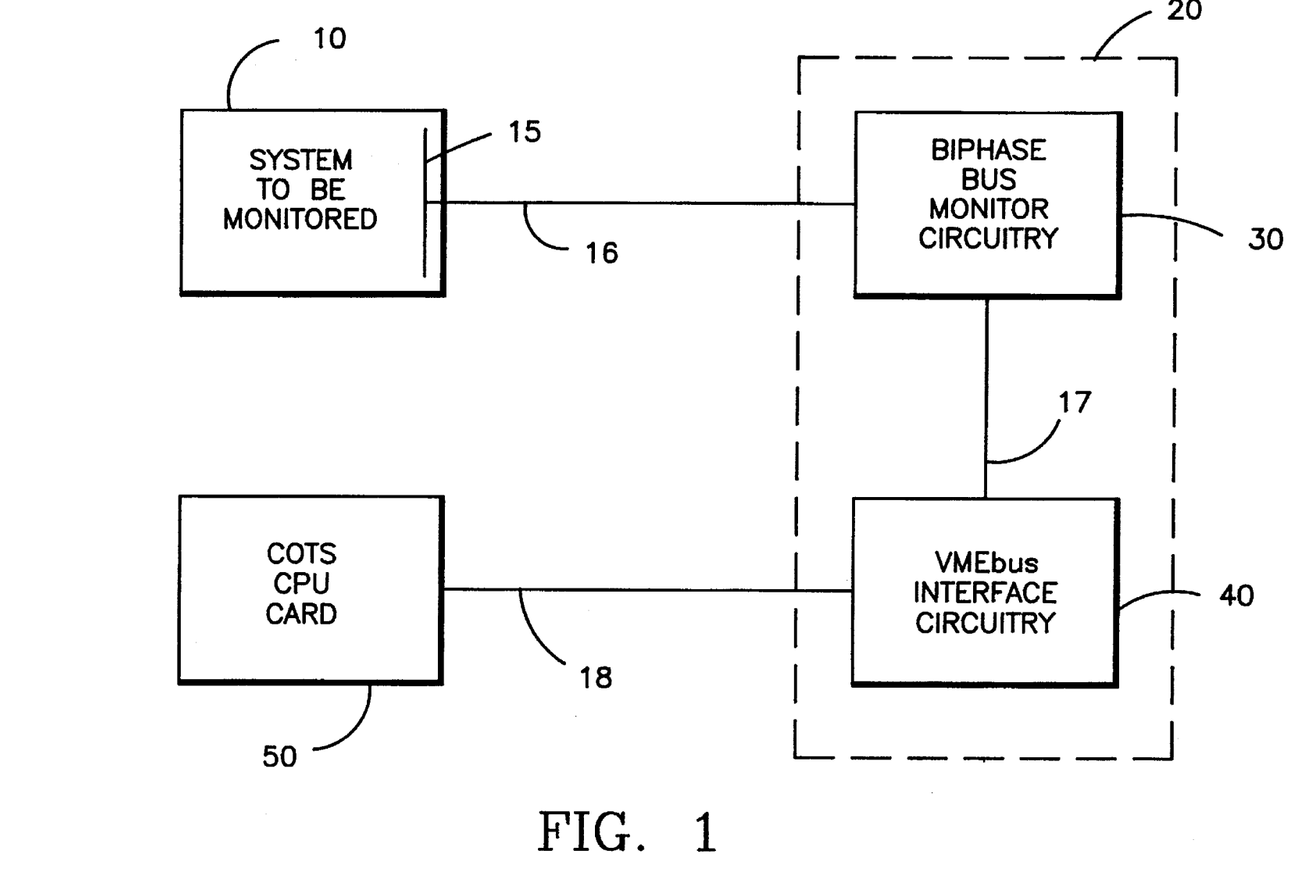
FIG. 1 is a simplified block diagram of the overall system of the present invention.

FIG. 1 is an overall block diagram of a preferred embodiment of the subject invention. Data processing system 10, with a bus 15 which is to be monitored, is interfaced with the present invention, a biphase bus monitor 20, via connection 16. The biphase bus monitor 20 includes biphase bus monitor circuit 30 and VMEbus interface circuit 40, each in communication with the other via signal path 17. In addition, the VMEbus interface 40 is in communication with a commercial-off-the-shelf (COTS) central processing unit (CPU) card 50, via connection 18. Generally, a user of the subject invention first initializes the system with information regarding the width of the bus to be monitored. The subject invention hipbase bus monitor is completely software configurable to monitor any biphase bus within a given word length. In addition, the user enters information regarding parity, and single-bit error checking is enabled or disabled.

Parity can be chosen for the biphase bus monitor (BBM) as either even or odd. Even parity is defined as an even number of ones in the data stream, odd parity is an odd number of ones. Thus, the user can select the type of parity depending upon the particular bus which is to be monitored.

Parity is closely tied to the selection for single-bit error checking. Single-bit error checking can be selected as on or off. By selecting on, single-bit error checking will be performed on every incoming data word, selecting off will perform no error checking as each word is captured and stored.

The user controls the selection of each of the above options through the use of a user program. The program can ask the setting for each these selections, or can hardcode a selection that will always be performed.

This initial configuration information is entered through the COTS central processing unit card 50. Such a card could be, for example, a Mizar MZ8115 CPU card, which contains a Motorola MC68010 CPU. Interface CPU cards will be familiar to those with skill in the art, and need not be discussed further. After the initial configuration data is sent from an external processor contained on the COTS CPU card (not shown), to the biphase bus monitor circuity 30, via the VMEbus interface card 40, the external processor enables a decoder section within the system. The decoder section, to be described later, decodes the selected bus size and stores the data accordingly in system storage FIFO's, also to be discussed later. Once the FIFO's are full, they transmit appropriate ready signals to system status registers. The aforementioned external processor then addresses the hipbase bus monitor system, through the VMEbus interface 40, accessing the stored data in the FIFO's. When the external processor is ready to receive more data, it repeats the process by enabling system circuitry to capture more data.

Figure 2:
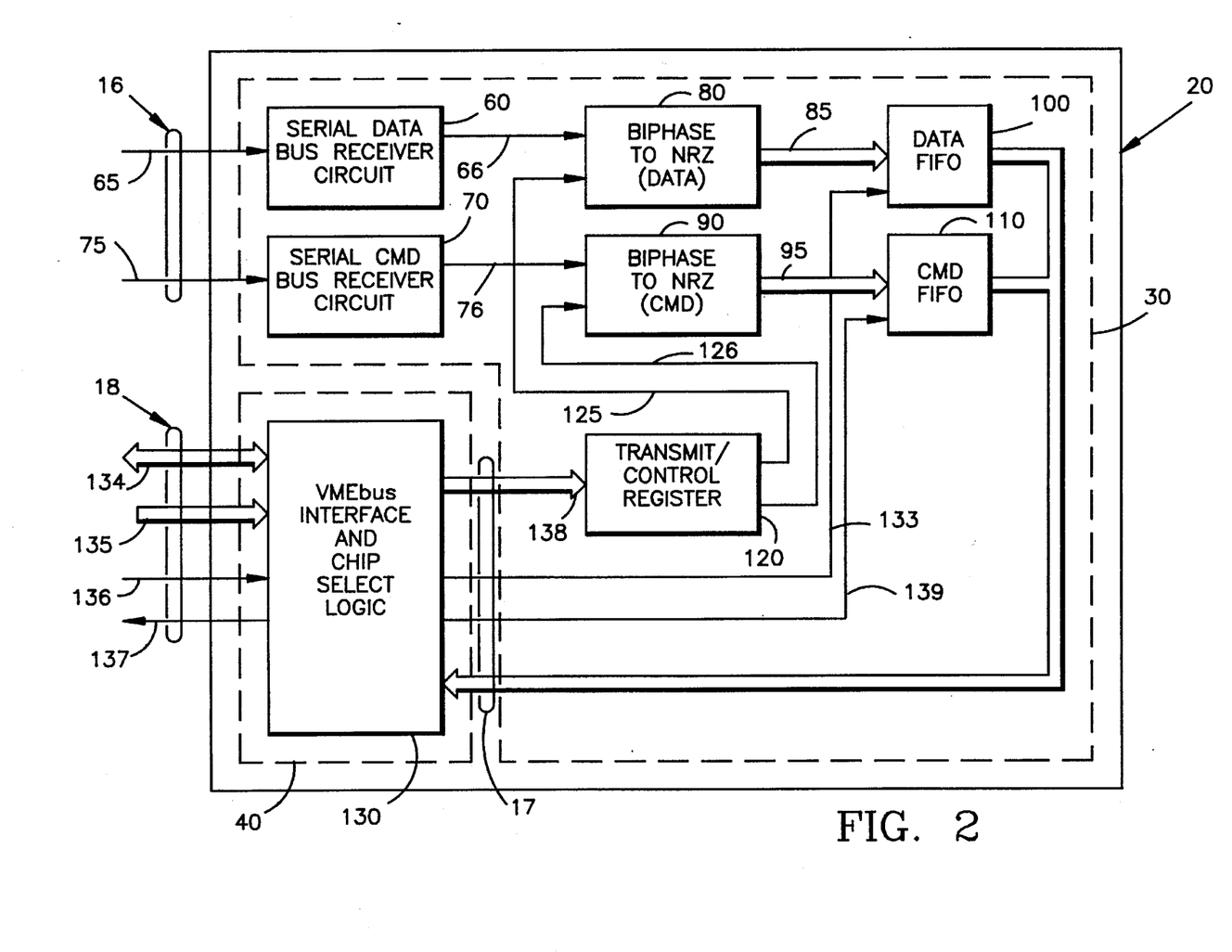
FIG. 2 is a block diagram of the biphase bus monitor circuitry.

FIG. 2 is a block diagram of the biphase bus monitor 20, including biphase bus monitor circuit 30 and VMEbus interface circuit 40. Serial data bus receiver circuit 60 and serial command bus receiver circuit 70 directly interface to a data processing system to be monitored through connection 16, receiving data and command signals therethrough. The serial data bus receiver circuit 60 is connected through data bus path 65 to the data bus of the system to be monitored (not shown) and serial command bus receiver circuit 70 is connected through the command bus path 75 to the command bus of the system to be monitored (not shown). As will be explained shortly, the serial bus receiver circuits 60 and 70 convert Manchester II data at differential levels (i.e. +/−15 volts) to Manchester II data at TTL levels (i.e. 0 to +5 volts).

After processing their respective data and command signals, the bus receiver circuits pass their outputs along paths 66 and 76 to respective biphase-to-NRZ (data) 80 and biphase-to-NRZ (command) 90 circuits. The biphase-to-NRZ (BTN) circuits, through circuitry to be described in more detail shortly, convert TTL level Manchester II data to binary, non-return to zero (NRZ) data. In addition the BTN circuits utilize shift registers to transform their serial data input to parallel data at their output along signal path 85.

The BTN circuits pass parallel data and command signals along parallel signal paths 85 and 95, respectively, to first-in-first-out (FIFO) storage devices. One FIFO 100 stores data signals and another FIFO 110 stores command signals. The FIFO's are 16-bit wide and each can store up to 1024 words of 16-bits each. The FIFOs store all data captured from the bus for later retrieval by the aforementioned external processor card 50.

The Transmit/Control Register (TCR) block 120 in FIG. 2, includes a programmable logic device (PLD), status register's (SR's) and control registers (CR's), each of which will be described later. The programing of PLD's to carry out complex digital processes is a conventional practice, known to those with skill in the art of digital design. In this case, the PLD is configured as a counter and contains circuitry that allows changing the selected count configuration depending on the number of bits (i.e. 2 to 28 bits) per dataword to be converted from Manchester II to NRZ. Communication with the BTN circuits occurs via signal paths 125 and 126. In addition, it generates the correct write pulses for the FIFO's and clear signals for the shift registers. Moreover, it also contains circuitry that implements error detection. The SR's acquire data from different points within the biphase bus monitor, defining such information as: Manchester errors, valid data identification, and status flags from the FIFO's (i.e. empty flag, half-full flag, and full flag). The control register's allow the user, through the external processor, to properly configure the biphase bus monitor system with the bus size for decoding, parity select, error checking and decoder enabling/disabling.

The VMEbus Interface and Chip Select Logic (VBI) 130 provides the required circuitry for the present invention to reside in a VMEbus environment. The VBI was designed to decode the VMEbus short Input/Output (I/O) address range, communicating with an external processor via connection 18, as has been said previously. Specifically, the VBI communicates with an external processor via data bus 134, address bus 135 and via various control lines, schematically depicted as 136 and 137. As will be explained later, using only a minimal amount of integrated circuits the short I/O address range is decoded to properly address the different components read by the external processor, including, the two FIFO's, the Status Registers, and the Control Registers. Information such as size/parity and additional control information is communicated over signal paths 138, 133 and 139. The VBI provides an effective means by which any external processor can read captured data from the biphase bus monitor. In addition, the VBI provides a means by which a user can properly configure and acquire the status of the BBM.

Figures 3, 4:
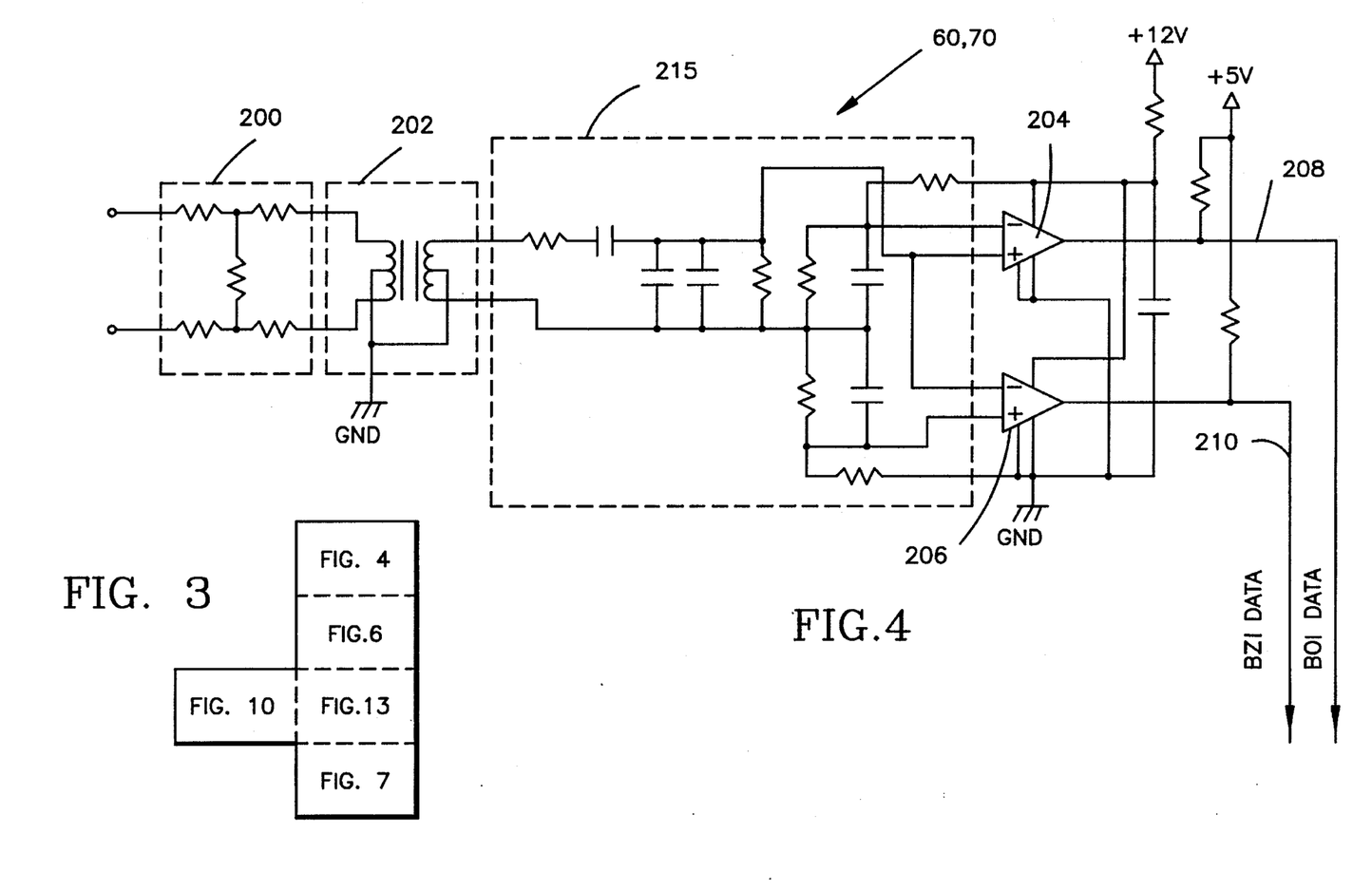
FIG. 3 is a block diagram showing the interrelationship of various other Figures.
FIG. 4 is a schematic diagram of the serial data bus receiver circuitry used in the present invention.

Turning our attention to FIGS. 3–16, a more detailed discussion of circuit operation will follow. FIG. 3 provides a graphical representation of the relationship between various of the Figures.

FIG. 4 schematically illustrates one of two identical serial bus receiver circuits. As was discussed with regard to FIG. 2, Manchester II encoded data enters the biphase bus monitor through one or both of the two serial bus receiver circuits (SRC's). Two SRC's are provided to interface to either a data bus (for example, Manchester BUS A) or a command bus (for example, Manchester BUS B), individually or simultaneously. To reiterate, the SRC's effectively convert Manchester II data at differential levels (i.e. +/–15 volts) to Manchester II encoded data at TTL levels (i.e. 0 to +5 volts).

As illustrated in FIG. 4, impedance matching circuit 200, comprising a resistor network, will preferably match the impedance of the biphase bus monitor to the bus to which it is interfaced. In the preferred embodiment, this circuit provides an impedance match of 78 ohms, the standard impedance as described in MIL-STD1553B. This will allow for the monitor to interface a MIL-STD1553B bus without loading it any further. A 1:1 transformer 202 provides the proper transformer coupling needed to properly interface such a bus. The resistor and capacitor network 215 leading up to operational amplifiers 204 and 206 filters the signals provided at the inputs of the op-amps, preferably LM119J IC's. This signal filtering provides for the proper signal levels at the non-inverting and inverting inputs of the op-amps. The proper signal levels are converted from differential, +/–15 volts, to TTL, 0–5 volts, used by the remainder of the biphase bus monitor design. The op amps are configured as comparators, in that op-amp 204 senses the positive sense signal from the monitored bus, while op-amp 206 senses the negative sense signal of the bus. The output waveforms from the LM119J's are still Manchester II, but their voltage levels are now TTL. These signals are passed to the previously mentioned biphase to NRZ conversion circuits via signal line 208, labelled BOI DATA (biphase one input), and signal line 210, labelled BZI DATA (biphase zero input). Note, that an identical circuit is used to perform level conversion for command data as well.

As has been mentioned previously, the serial receive circuitry is used as an interface medium between the biphase bus monitor circuit and a bus to be monitored. Such a bus could, for example, be a military standard 1553B bus. In the preferred embodiment, the serial receive circuitry was specifically designed to interface with space flight certified MIL-STD-1553B buses. The circuit components used in the design of the receive circuitry are space flight approved. The design provides a transformer coupled input, with impedance matching, so as to not put any extra load on the bus. In this manner, a true monitoring of the bus can occur without adding transient effects. Although the biphase bus monitor preferably interfaces with space flight certified MIL-STD-1553B buses, the design of the receive circuitry does not preclude use with other types of non-space flight certified buses.

Figure 5:
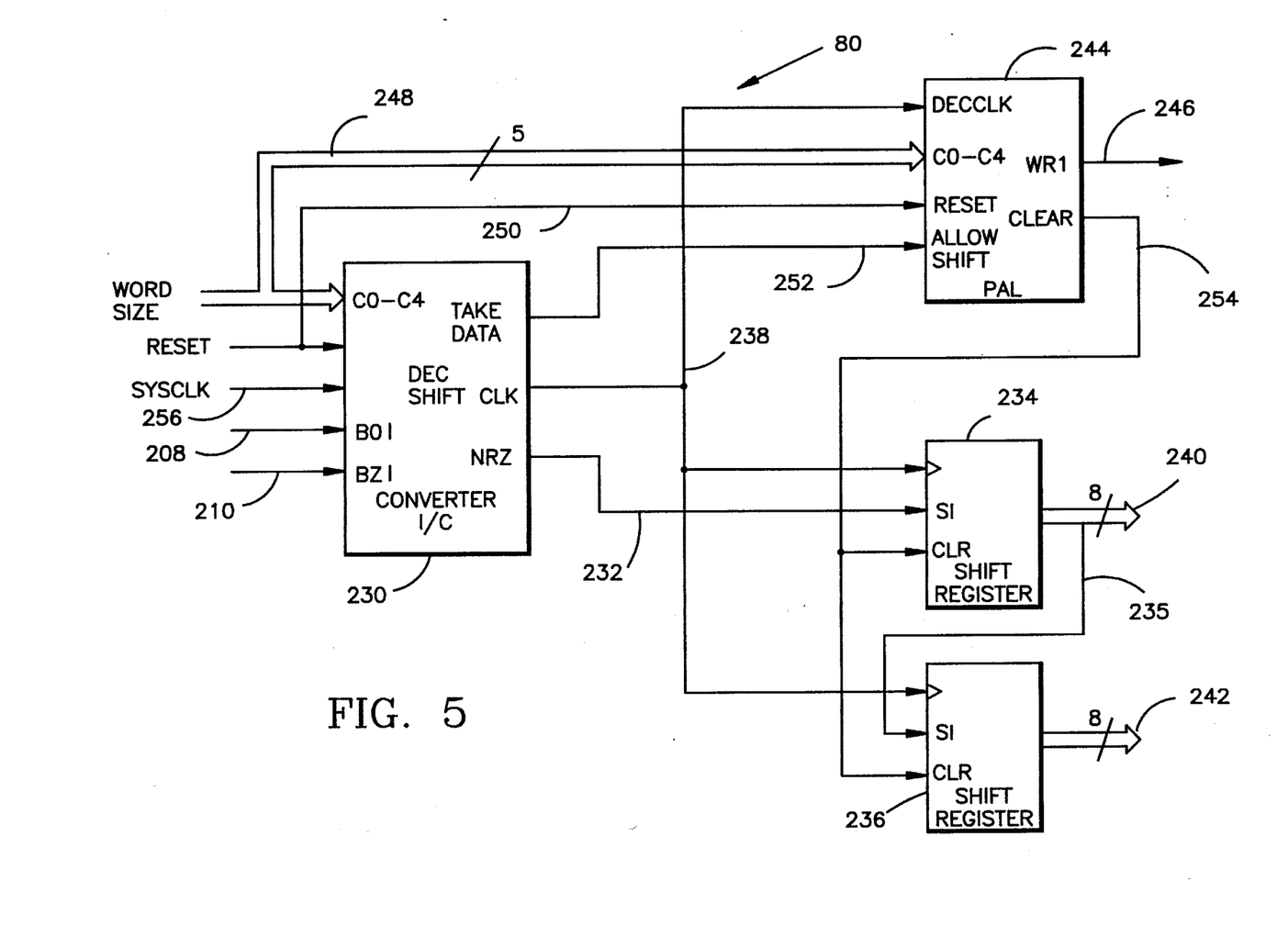
FIG. 5 is a block diagram of the biphase to NRZ and serial to parallel circuitry used in the present invention.

FIG. 5 schematically illustrates the biphase to NRZ block (data) 80 from FIG. 2. Note that this will be similar for the biphase to NRZ (command) block 90. Each biphase-to-NRZ (BTN) includes a single, Harris HD-15531-D Manchester Encoder/Decoder integrated circuit 230, that converts the Manchester II data to Non-Return-to-Zero (NRZ) data, still at TTL levels. Signal line 208 supplies signals representing biphase ones, and signal line 210 supplies signals representing biphase zeros, each from the serial data bus receiver circuit 60. The encoder/decoder IC 230 outputs NRZ serial signals to shift register 234 via signal line 232. Next, serial-to-parallel conversion occurs, taking the serial NRZ data stream and converting it to a parallel format for storage. Data conversion can take place from busses having a width anywhere between 2-bit wide to as many as 28-bit wide data. This makes the biphase bus monitor functional with a wide variety of bus widths and protocols. The serial NRZ data is clocked into shift register 234 (and subsequently into shift register 236 via overflow signal path 235) in response to clocking signals output from the conversion IC 230 over signal path 238. The shift registers 234 and 236, preferably 74LS164 IC's, output parallel data over parallel busses 240 and 242. The BTN additionally includes a programmable logic device (PLD) 244 configured as a counter. The PLD controls the writing of the parallel data into the FIFO's 100 and 110 (FIG. 2) through output signal line 246. Timing of this signal is dependant upon the appropriate word size of interest supplied as inputs to the conversion chip 230 and PLD 244, over WORD SIZE bus 248. Timing is controlled by SYSCLK signal input to the conversion chip via line 256; a RESET signal input to the conversion chip and PLD via line 250; a TAKE DATA signal via line 252 from the conversion chip to the PLD; and a CLEAR signal over line 254 from the PLD to the shift registers.

Figure 6:
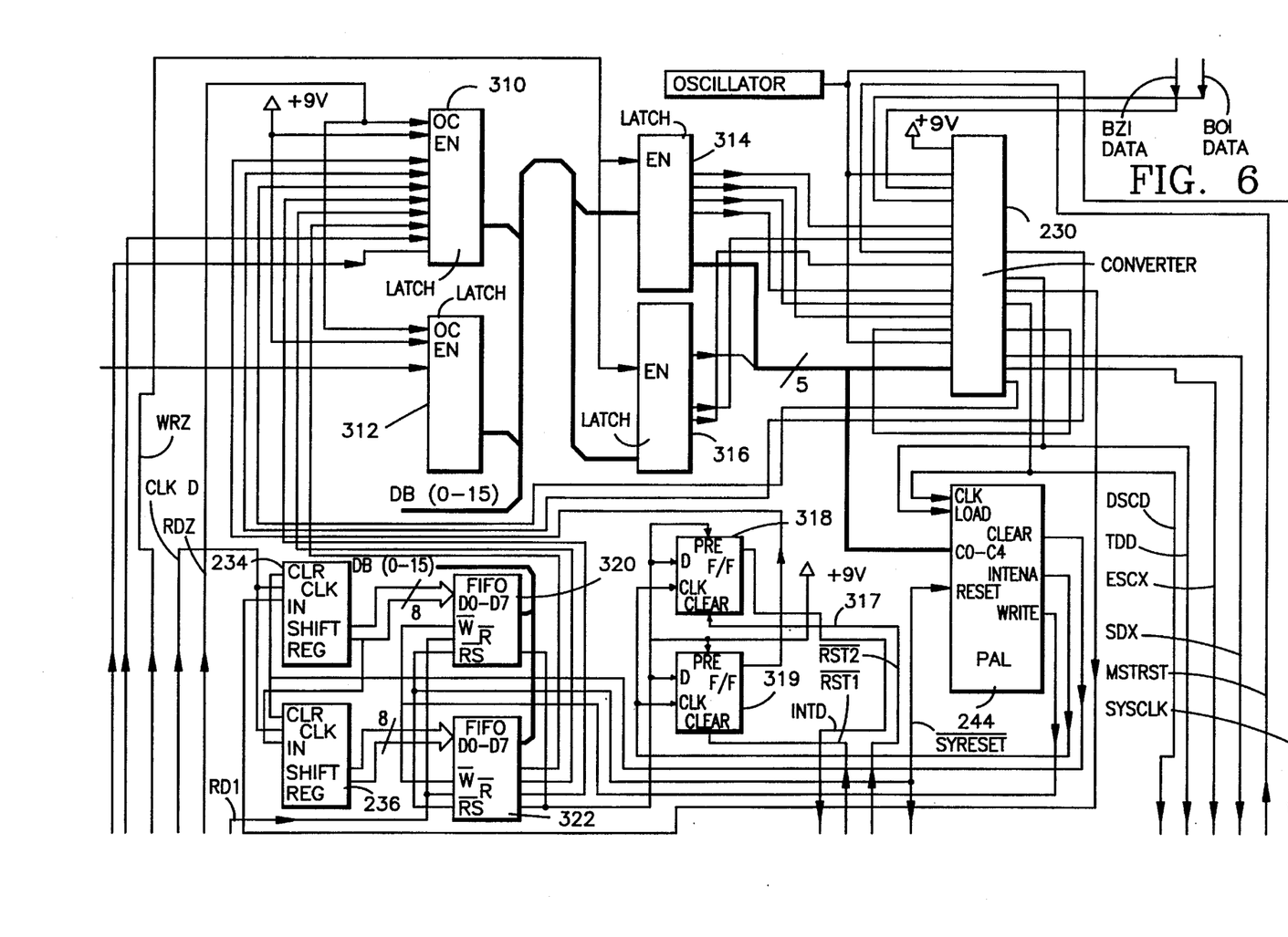
FIG. 6 is a schematic diagram of the interconnection of various components of the biphase to NRZ and serial to parallel circuitry (data), including control signals, of the present invention.
Figure 7:
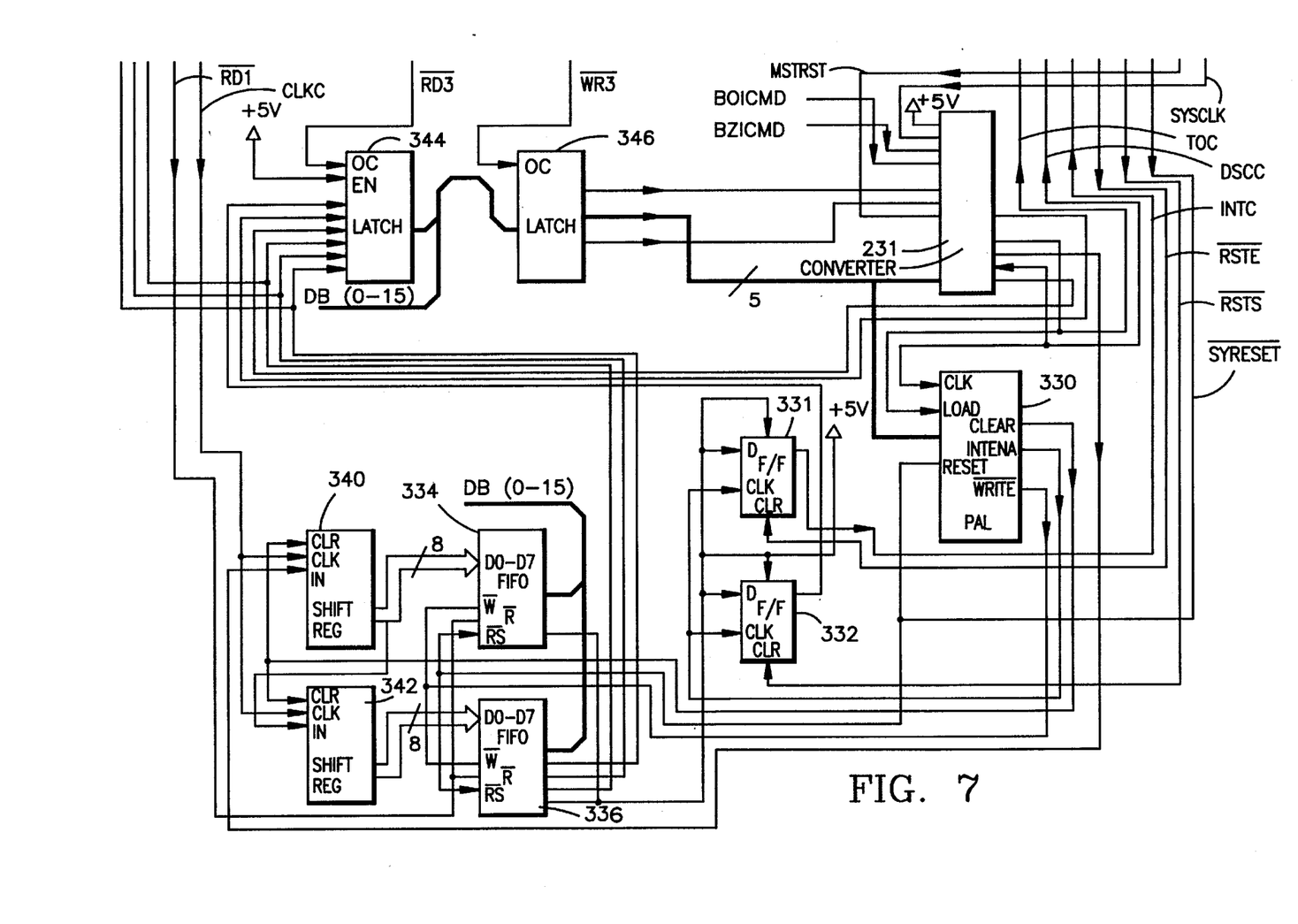
FIG. 7 is a schematic diagram of the interconnection of various components of the biphase to NRZ and serial to parallel circuitry (command), including control signals, of the present invention.
Figure 8:
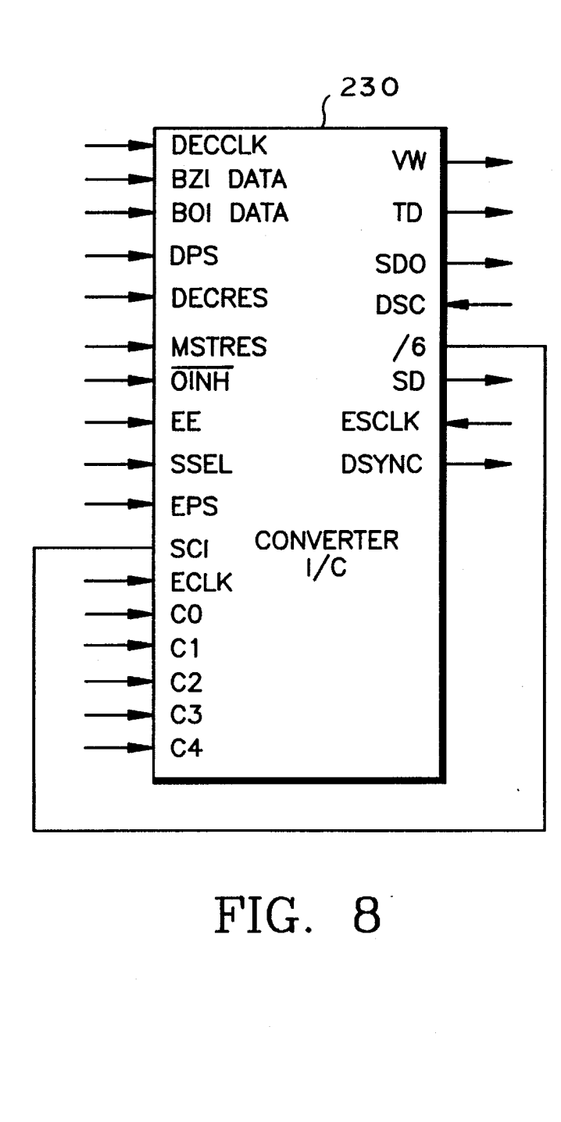
FIGS. 8 and 9 are diagrams which illustrate various input and output signals associated with conversion chips of FIGS. 6 and 7.
Figure 9:
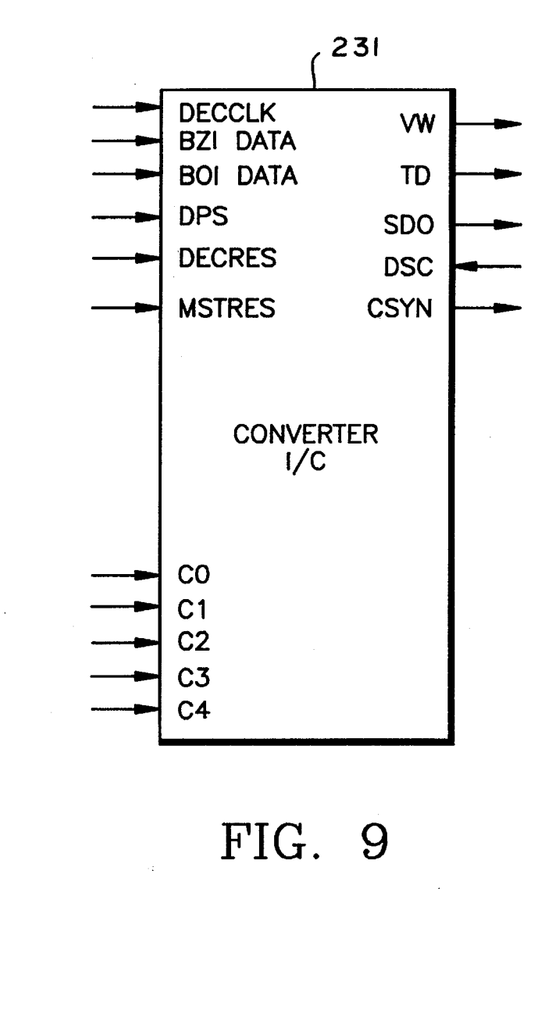

FIGS. 6 and 7 provide more detailed schematic information for the biphase to NRZ circuitry, including depiction of the storage FIFO's. FIG. 6 is the data circuit and FIG. 7 is the command circuit. Referencing FIG. 6, in particular, and similarly FIG. 7, conversion chip 230, PAL 244 and shift-registers 234 and 236 are shown with their proper interconnection. Also, latches 310, 312, 314 and 316, preferably 74LS373 IC's, are used as an interface between a system data bus and various system components for configuration and status information. Flip-flops 318 and 319 are used to set bits for interrupt signals. Flip-flop 318 outputs an interrupt signal INTD on signal line 317 for the data FIFO. Flip-flop 319 outputs status register information. Finally, two IDT7202 FIFO's 320 and 322 provide data storage. FIGS. 8 and 9 are provide a more convenient representation of the inputs/outputs associated with conversion chips 230 and 231.

Figure 10:
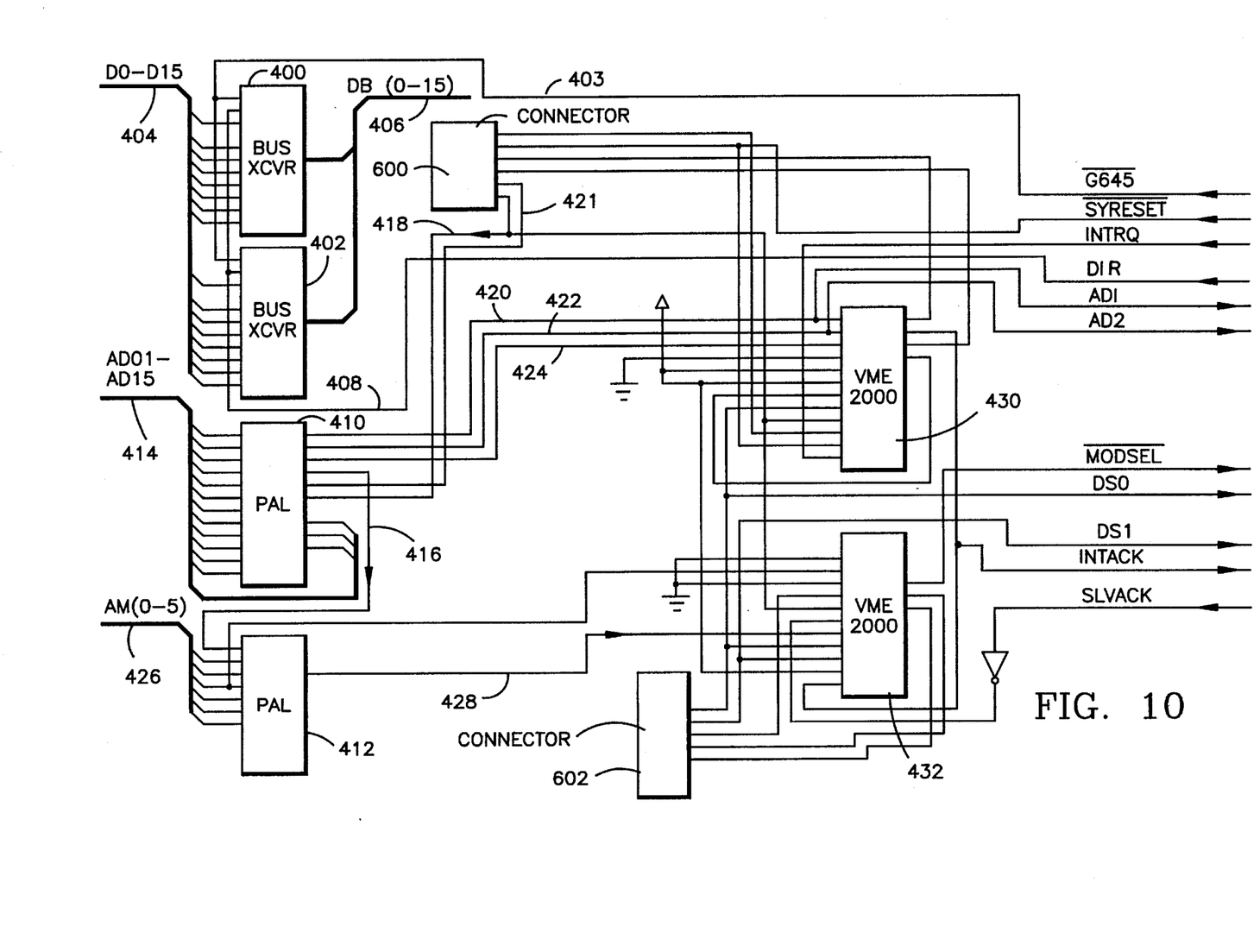
FIG. 10 is a schematic diagram of the interconnection of various components of the VMEbus interface of the present invention.
Figure 13:
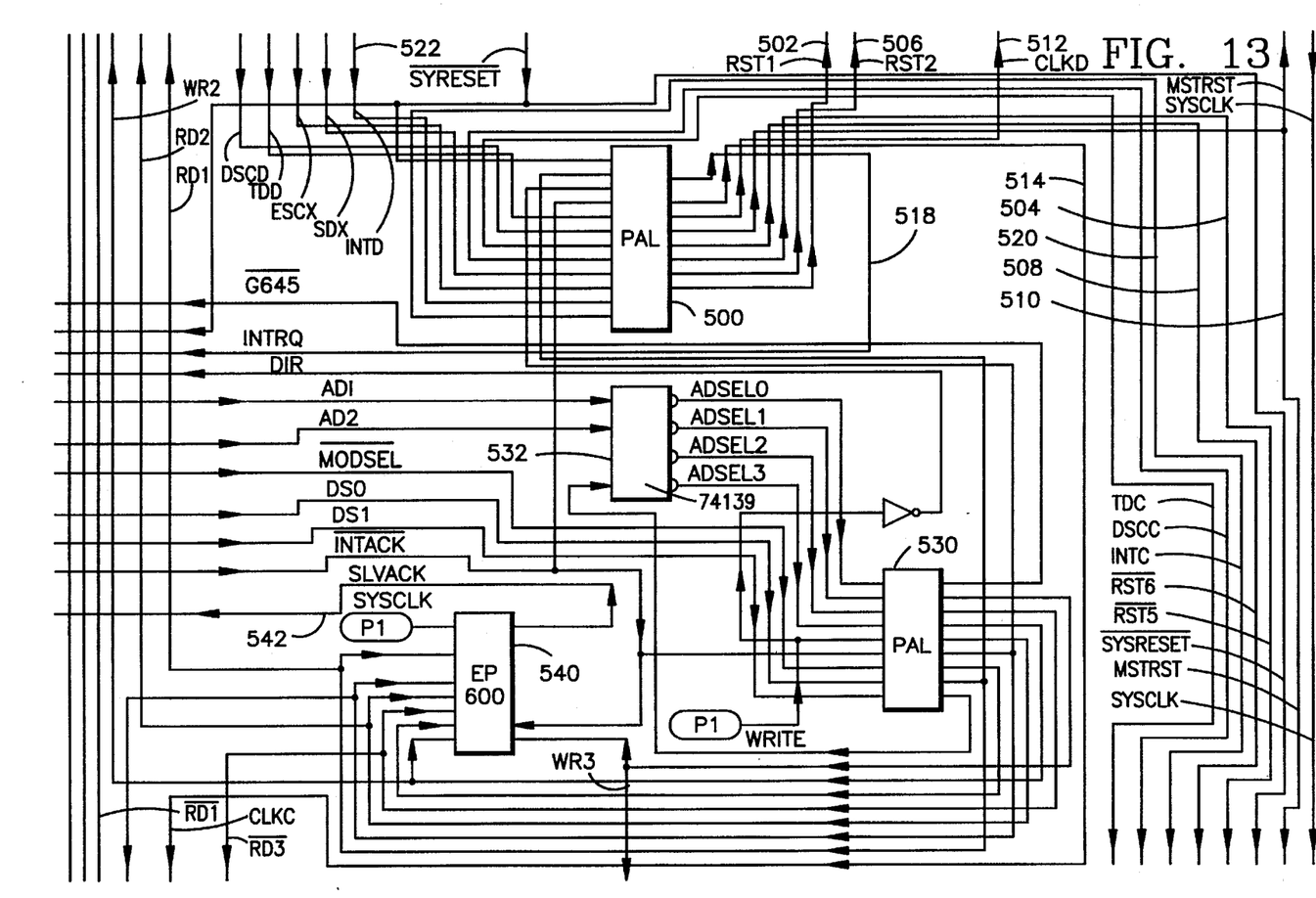
FIG. 13 is a schematic diagram of the interconnection of various components of the VMEbus interface of the present invention.

Turning our attention to FIGS. 10 and 13, the VMEbus interface (VBI) is schematically depicted in greater detail. The VBI uses the VMEbus short input/output address range and as such uses 16-bits of the VMEbus 32-bit address range, thus making the interface logic design easier and simpler. Referring to FIG. 10, two 74LS645 bus transceivers 400 and 402 are used to interface directly between the COTS card, not shown, and the biphase bus monitor. These bi-directional bus transceivers allow fast data transfer between the commercial off-the-shelf (COTS) CPU card, via data bus 404, and the biphase bus circuit, via system data bus 406. Signal line 408, labelled DIR, serves as an input to the bus transceivers to control which direction data will transferred. In addition the transceivers are enabled when an enable signal, labelled G645, is received on signal line 403.

Two PLD's 410 and 412 interface with the COTS card, their principle function to provide address decoding.

PLD 410, preferably a PAL22V10, is used for decoding the addresses supplied on the VME address bus 414 from the COTS card. This IC provides the decoding of the short I/O address range that the biphase bus monitor is configured for, directly outputting address signals AD1, AD2 and AD3 on signal lines 420, 422 and 424, respectively. This IC outputs an address correct signal AC to another PAL, to be described shortly, via line 416, upon receipt of two signals from the COTS card: a valid address signaled with an address strobe signal AS via address strobe line 418, and an invalid long word signal LWORD via signal line 421. These signals are checked for validity directly from the VMEbus address and control lines.

PLD 412, preferably a PAL16LS, performs the decoding of the VMEbus address modifiers input on bus 426 and makes the last check for a correct address match with the biphase bus monitor. This PAL outputs an address enable signal ADEN on signal line 428 when: the correct address modifier code is present; and, a valid address correct signal AC is present on line 416 from PAL 410.

Figure 11:
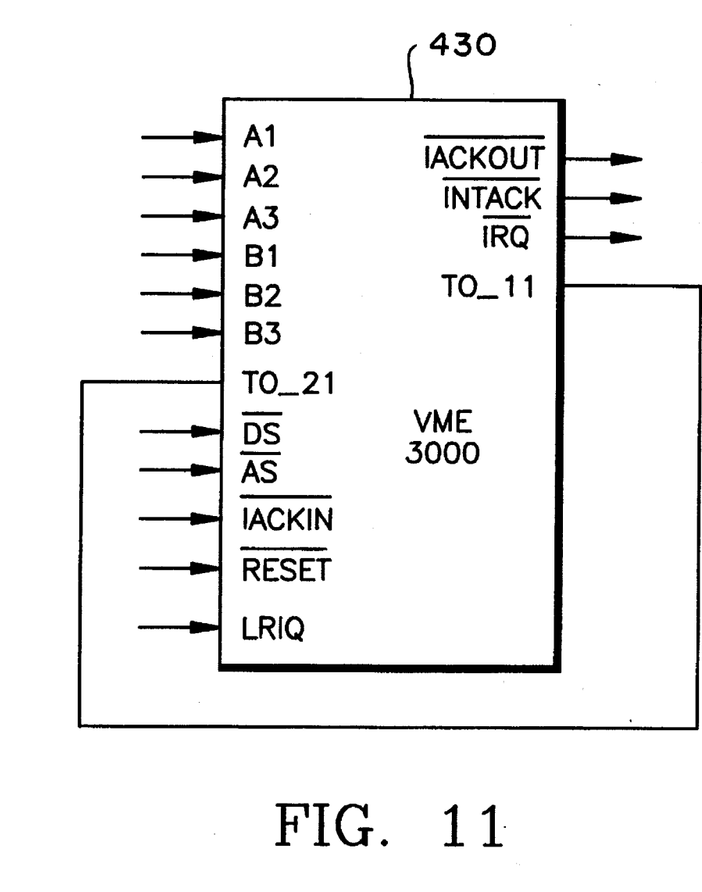
FIGS. 11 and 12 are diagrams illustrating various input and output signals associated with the interface chips of FIG.
Figure 12:
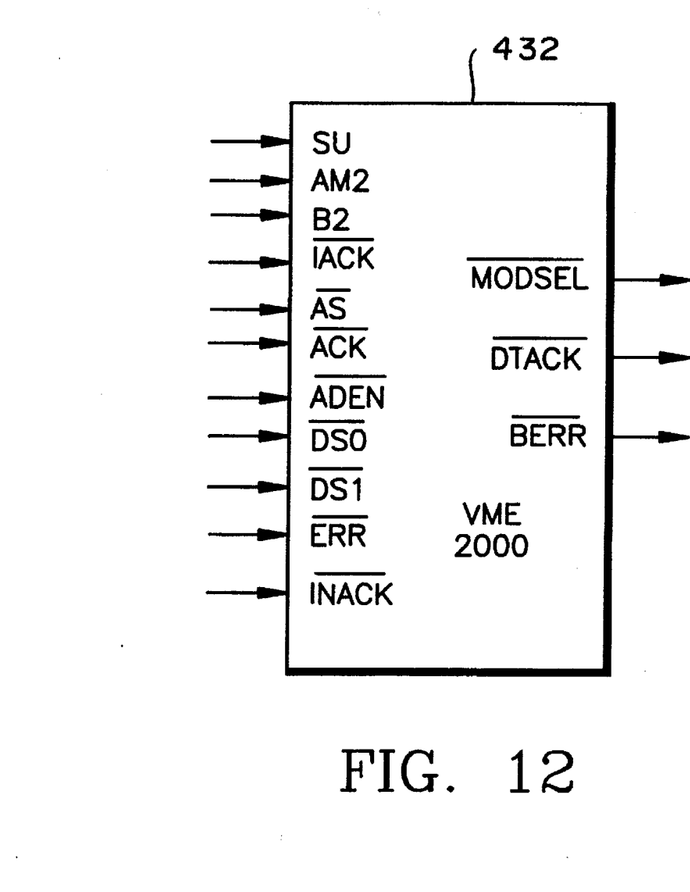

A commercially available, two-chip set provides additional VMEbus interface control. These IC's are the VMEbus Slave Module Interface Device 432, commercially known as the VME2000, and VMEbus Interrupt Generator 430, known commercially as the VME3000. The VME2000 receives acknowledgement of successful reads or writes of the biphase bus monitor, and generates the appropriate acknowledgement signals to the COTS CPU card. The VME3000 is provided for the programmer, in case it is desired to use the biphase bus monitor in an interrupt arrangement. FIGS. 11 and 12 are provided as a more covenient representation of the signal inputs/outputs associated with chips 430 and 432. Additional signals are provided to the biphase monitor through connectors 600 and 602.

Referring to FIG. 13, additional VMEbus interface logic is schematically depicted.

Programmable array logic device (PAL) 500, preferably a PAL22V10, contains logic that controls miscellaneous functions that control both the command bus and databus decoder circuits. Interrupt detect and generation logic is also present, and system reset responsibility resides within this IC. The IC contains all the logic necessary to generate various control signals for the circuitry used to initiate an interrupt condition. Output signal RST1, output on line 502, is used to reset a bit in the data bus status register. The output signal labelled RST5, output on line 504, is used to reset a bit in the command bus status register. Output signal RST2, output on line 506, is used to reset the interrupt sent to the CPU for the data FIFO. Output signal RST6, output on line 508, is used to reset the interrupt sent to the CPU for the command FIFO. An inverted output reset signal, labelled MSTRST, is used to reset the Harris conversion IC's via line 50 Two clock signals are used to clock data into the data and command FIFO's. Output clock signal CLKD is used to clock the data shift register via line 512. Output clock signal CLKC is used to clock the command shift register via line 514. Finally, an interrupt request signal INTRQ is output via line 518, with the receipt of an interrupt signal INTC input via line 520 from the command FIFO circuitry or from an interrupt signal INTD input via line 522 from the data FIFO circuitry.

Figures 14, 15:
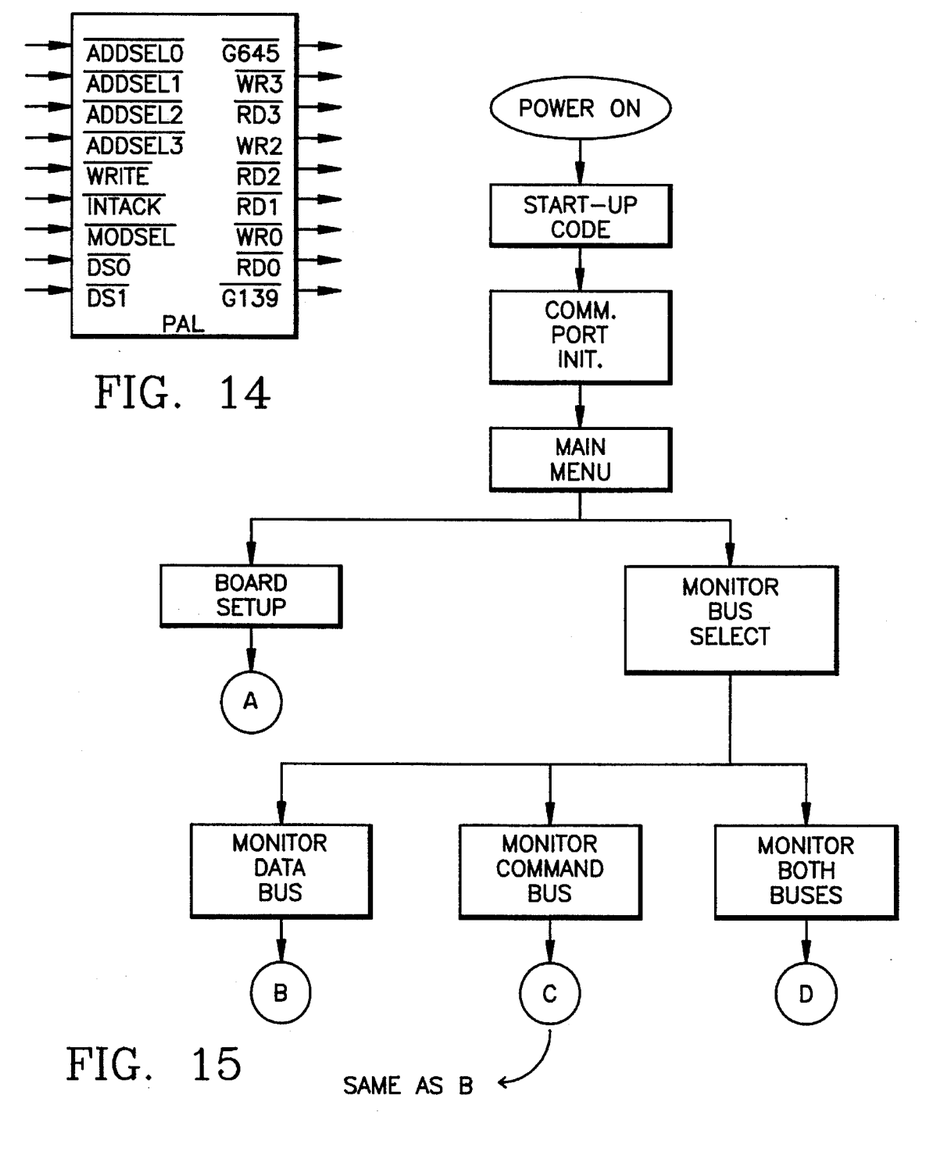
FIG. 14 is a diagram of relevant signal inputs and outputs for a programmable logic device of the present invention.
FIGS. 15–18 depict flow-charts of steps followed in the present invention.

Another PAL 530, preferably a PAL22V10, contains all of the "glue logic" that works in tandem with IC 532, a two-to-four (2–4) line decoder. The decoder IC 532, preferably a 74LS139, receives signals on address lines 420 and 422 from the VMEbus address lines 1 and 2, AD1 and AD2, respectively (See FIG. 10). These two address lines are used to determine four address select areas to determine which FIFO or latch in the biphase to NRZ circuitry (FIGS. 6 and 7) needs to be read from or written to as addressed by the COTS CPU card programming. In addition, PAL 530 generates the appropriate read and write signals for the bidirectional bus transceivers 400 and 402, for data transfer between the biphase bus circuit and the COTS CPU. FIG. 14 is a more convenient representation of the signal inputs and outputs associated with PAL 530. Specifically: ADDSEL0-3 are address select inputs arriving from 2–4 decoder IC 532; WRITE is a read/write input signal from the COTS CPU card; INTACK is an interrupt acknowledge input signal from the VMEbus Interrupt Generator IC 430; MODSEL is a module select input signal from the VMEbus Slave Module Interface Device 432; DS0-1 are VMEbus data strobe input signals from the COTS CPU card; G139 is an enable signal output to the 2–4 decoder IC 532; RDO-1 are read signals output to the data and command FIFO's respectively; output signal WR0 is a write signal for the data FIFO; output signal RD2 is a read signal for the data bus status registers of the data FIFO circuitry; output signal WR2 is a write signal for the data bus control registers of the Data FIFO circuitry; output signal RD3 is a read signal for the command bus status registers of the command FIFO circuitry; output signal WR3 is a write signal for the command bus control registers of the command FIFO circuitry; and, G645 is an output signal for enabling the bidirectional bus transceivers 400 and 402.

The final PAL 540, preferably an Altera EP600, controls the generation of data transfer acknowledge signals. This PAL determines which of the various read and write input signals requires an acknowledgement to be provided to the COTS CPU card and appropriately does this by supplying an acknowledge signal SLVACK to the VMEbus Slave Module Interface Device 432, via signal line 542. The Slave Module Device generates the actual acknowledgement signal.

Figures 16, 17:
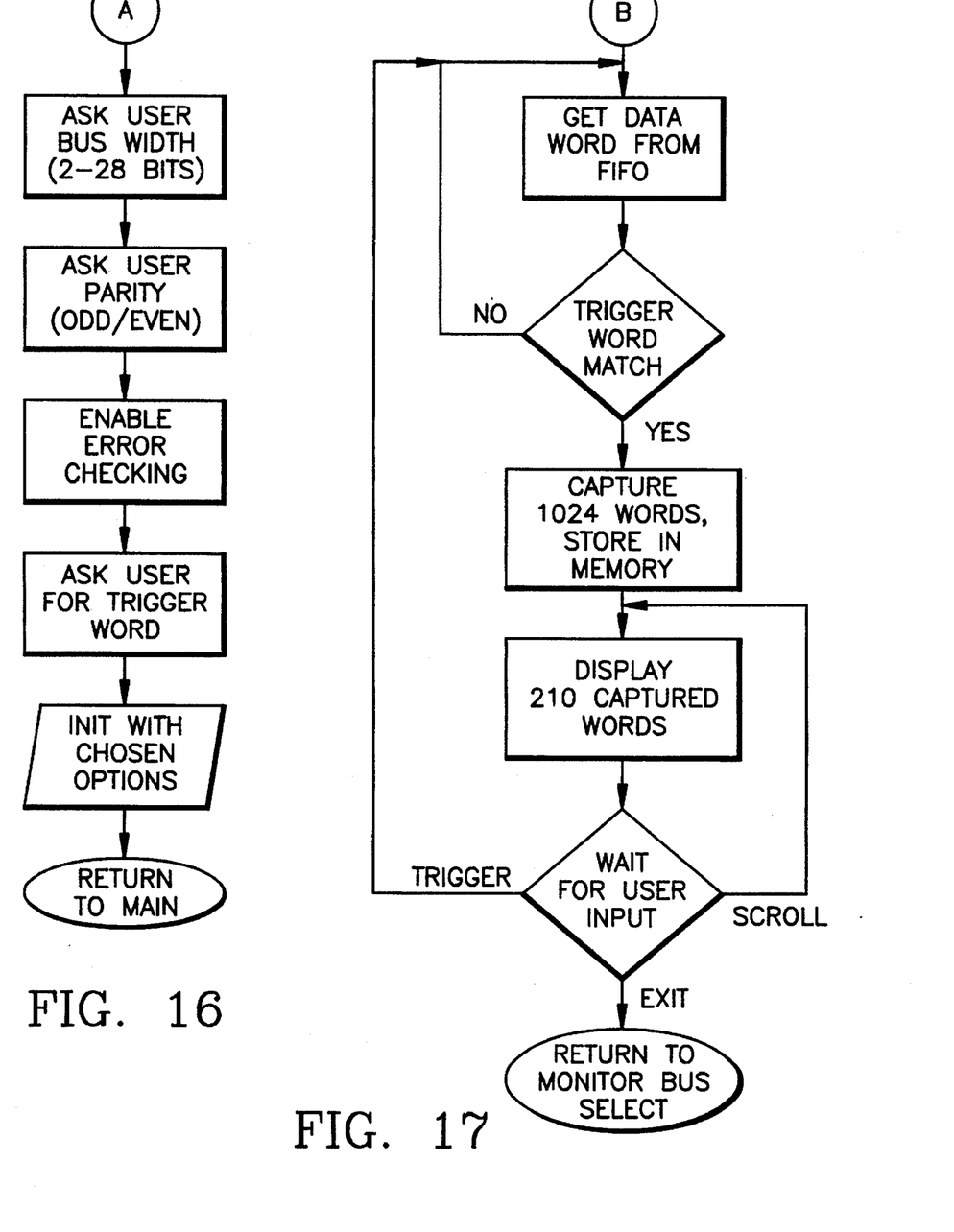
Figure 18:
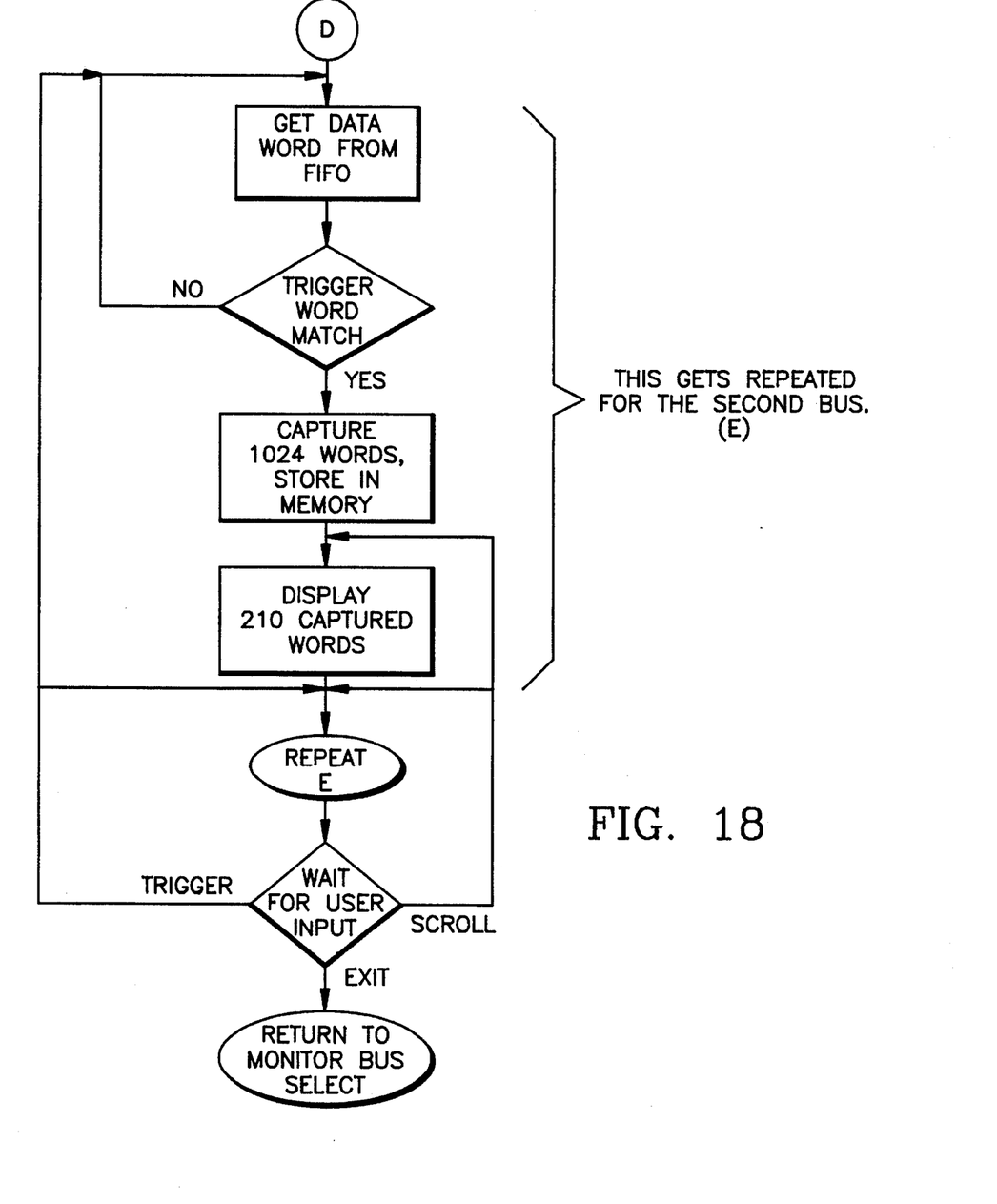

The remaining FIGS. 15–18 provide a flowchart of the operation of a preferred form of the present invention. FIG. 15 shows steps related to initial power-up and communication port initialization resulting in the display of a menu on the external interface equipment. As is known to those familiar with the programing arts, sufficient programing can be utilized to direct the user to enter various parameters as depicted in FIG. 16, thus configuring the biphase bus monitor system and including such parameters as bus width, parity selection, error checking enable and trigger word selection. After system set-up, FIG. 17 generally depicts the steps followed by the biphase monitor circuitry to capture and display words from a single bus, either a command bus or a data bus in the preferred form of monitored bus. FIG. 18 generally depicts the steps followed by the biphase bus monitor circuitry to capture and display words from the command and data busses simultaneously.

An alternate design for the biphase bus monitor would configure the external CPU and its accompanying control logic with the biphase bus monitor circuitry, all on a single card. Read only memory (ROM) would be required to place the controlling program on the same card, and an RS-232-C interface would be needed to provide a terminal connection for data captured off the Spacelab bus. Consequently, the only external requirement would then be a terminal interface, whether touch screen or dumb terminal with keyboard, and, of course, the VMEbus environment.

Another system design change would make the circuitry work outside the VMEbus environment. In this manner, the biphase bus monitor system could then be entirely standalone with no external requirements except for the terminal interface to control the monitor circuitry.

As a system the biphase bus monitor can be configured to work with a variety of other checkout systems at Kennedy Space Center. These include the Partial Payloads Checkout Unit (PPCU) (i.e., 28-bit bus width), or the Cargo Integration and Test Equipment (CITE) system (i.e., 16-bit bus width).

As a system, the biphase bus monitor, with its controlling program, can capture any arbitrary 1,024 data words on the Spacelab bus. Additionally, test engineers can configure the biphase bus monitor to start capturing words only after finding a specific word on the bus. This is called trigger capability, and any word believed to be on the bus can be the trigger. Trigger capability is an option that is implemented through a user program. Such programs are known by those skilled in the art of digital programming. Such a program would contain code that request's the user to enter a specific data word with which to start a capture. Through software, incoming data words converted by the BBM are checked for a match, and, if a match occurs, the software would allow the BBM hardware to capture up to 1,024 words, including the trigger word. (Subsequently, these data words are stored for later retrieval and viewing on a terminal.) If a match does not occur, the next word is checked. It is conceivable that a user could enter a trigger word that will never be found on the bus. Therefore, care must be taken by the programmer to add code that can allow the user to stop the trigger search if a considerable amount of time passes without any capture of data.

Additionally, the trigger capability can be designed to allow triggering on a portion, rather than the whole, of the data word. For example, if a user believes that there will be data words with an "A" as the third out of four hexadecimal (hex) digits, then the program should provide the capability to trigger on XXAX (where X represents don't care situations). Thus, any incoming data word having an "A" as the third hex digit will cause a capture to begin. Furthermore, this can be extended to more than one digit, triggering on XXAA, XAAA, or any combination of hex numbers, in any position.

In summary, the biphase bus monitor can use any type of terminal (i.e., VT100, touch screen, etc.) as the primary interface for a user. Through the interface the user must first configure the biphase bus monitor card for the bus that it will monitor. The BBM is completely software configurable to monitor any biphase bus within a given word length range. The hardware allows users to configure the BBM to monitor buses of word lengths between 2 and 28 bits long. Parity is another user entered parameter. In addition, users get the choice of enabling or disabling error detection, which uses parity sensing provided by the hardware. Finally, users can choose to "trigger" and "capture" all data after a particular work is found.

All of the above mentioned selections are provided on a single screen on the terminal. Once these selections are made, the card is ready to monitor Manchester II waveforms, and convert them to binary for storage in first-in-first-out (FIFO) integrated circuits. The hardware configuration allows the capture of 1,024 words, from two busses simultaneously, using two identical interface circuits.

While the invention has been shown and described with reference to a preferred embodiment thereof, it will be understood that persons skilled in the art may make modifications thereto without departing from the spirit and scope of the invention as defined by the claims appended hereto. For example, since the biphase bus monitor is completely software configurable, its only external requirement for functioning is the use of any Commercial Off-The-Shelf (COTS) Central Processing Unit (CPU) card. An appropriate card would be a Mizar MZ8115 CPU card which contains a Motorial MC68010 CPU. The COTS card is needed for receiving the date from the biphase bus monitor card and displaying it on the terminal. Additionally, the COTS card will contain the firmware needed to properly run the biphase bus monitor, and make full use of all the monitors features and options. In this manner, any COTS card that meets or exceeds the requirements provided by the MZ8115 can be used as the CPU for the monitor system.

I claim:

1. A method for monitoring a data bus to determine signals transmitted on the bus, comprising the steps of:

initializing a data capturing means with parameters characteristic of a protocol used to transmit data on the monitored data bus, including word size and parity, and initializing the data capturing means with trigger words, which when recognized by the data capturing means, are used to initiate data capturing from the monitored bus;

capturing data words from a monitored system bus based on the initializing parameters;

converting captured data words having a first data format to data words having a second data format;

storing said converted data words in a storage device;

retrieving said converted data words from the storage device; and, displaying said converted data words.

2. The method of claim 1 wherein said converting step includes the additional steps of:

converting captured data words having a first signal level format to intermediate data words having a second signal level format; and, converting said intermediate data words having said second signal level format to converted data words having said second data format.

3. The method of claim 2 wherein said first data format is manchester, said first signal level format is differential, said second signal level is TTL and said second data format is non-return-to-zero.

4. Apparatus for monitoring a data bus to determine signals transmitted on the bus, comprising:

means for capturing data words from a monitored data bus, the bus using a predetermined data transfer protocol;

means for initializing said means for capturing data words with parameters characteristic of the protocol used to transmit data on the monitored data bus, including word width and parity, said means for initializing also allowing initializing said means for capturing data words with trigger words which when sensed, initiate data word capture;

means for converting captured data words having a first data format to data words having a second data format;

means for storing said converted data words in a storage device;

means for retrieving said converted data words from the storage device; and, means for displaying said converted data words.

5. The apparatus of claim 4 wherein said means for converting converts captured data words from manchester format to data words having non-return-to-zero format.

6. The apparatus of claim 4 wherein said means for converting includes:

means for converting said captured data words having said first data format and a first signal level format to intermediate data words having a second signal level format; and, means for converting said intermediate data words having a second signal level format to converted data words having said second data format.

7. Bus monitor apparatus responsive to an external user program for displaying data transmitted on a bus comprising:

means for capturing data words transmitted on the bus;

level converting means for converting captured data words having a differential signal level format to intermediate data words having a unipolar signal format;

means for converting said intermediate data words from biphase format to data words having non-return-to-zero format;

means for storing said converted data words;

means for retrieving said converted data words from said means for storing;

means for displaying said converted data words retrieved from said means for storing; and, control means, responsive to the user program, for controlling said means for capturing data words, said level converting means, said means for converting from biphase format to non-return-to-zero format, said means for storing, said means for retrieval, and said means for displaying.

* * * * *